United States Patent
Green

(10) Patent No.: US 6,709,556 B2
(45) Date of Patent: Mar. 23, 2004

(54) PLASMA PROCESSING APPARATUS

(75) Inventor: Gordon Robert Green, Bristol (GB)

(73) Assignee: Trikon Technologies Limited, Gwent (GB)

(*) Notice: Subject to any disclaimer, the term of this patent is extended or adjusted under 35 U.S.C. 154(b) by 0 days.

(21) Appl. No.: 10/364,343

(22) Filed: Feb. 12, 2003

(65) Prior Publication Data

US 2003/0150720 A1 Aug. 14, 2003

Related U.S. Application Data

(60) Provisional application No. 60/391,975, filed on Jun. 28, 2002.

(30) Foreign Application Priority Data

Feb. 14, 2002 (GB) .............................................. 0203452

(51) Int. Cl.[7] ............................................. C23C 14/34
(52) U.S. Cl. .............................. 204/298.07; 204/298.11; 204/298.15
(58) Field of Search ....................... 204/298.07, 298.11, 204/298.15

(56) References Cited

U.S. PATENT DOCUMENTS

| | | | |
|---|---|---|---|
| 5,108,569 A | 4/1992 | Gilboa et al. | 204/192.13 |
| 5,304,279 A | 4/1994 | Coultas et al. | 118/723 I |
| 5,470,451 A * | 11/1995 | Kobayashi et al. | 204/298.03 |
| 5,810,982 A * | 9/1998 | Sellers | 204/298.08 |
| 6,296,747 B1 | 10/2001 | Tanaka | 204/298.07 |

FOREIGN PATENT DOCUMENTS

| | | |
|---|---|---|
| EP | 0 430 229 A2 | 11/1990 |
| EP | 0 860 513 A2 | 8/1998 |
| EP | 0 860 514 A2 | 8/1998 |
| JP | 1-149956 | 6/1989 |

* cited by examiner

Primary Examiner—Rodney G. McDonald
(74) Attorney, Agent, or Firm—Volentine Francos, PLLC

(57) ABSTRACT

A sputter apparatus (10) includes a chamber (13a) housing a target (11), a work piece support (12) and a process area (14) between the target and the support. The apparatus further includes an inlet (24) for process gas and a pumping outlet (27) from the process area. The inlet substantially surrounds the support and the apparatus includes a pumping outlet separate from the inlet. The inlet is shielded from the process area.

13 Claims, 1 Drawing Sheet

PLASMA PROCESSING APPARATUS

A claim of priority has been made to U.S. provisional application Serial No. 60/391,975, filed Jun. 28, 2002, the entirety of which is incorporated herein by reference.

FIELD OF THE INVENTION

This invention relates to plasma processing apparatus and in particular, but not exclusively, to sputter deposition apparatus.

BACKGROUND TO THE INVENTION

In sputter deposition, uniform gas distribution within the chamber is important for achieving uniformity of process upon a substrate, such as a semiconducting or insulating wafer, disc or panel. In such chambers there is generally a target facing the substrate and so the gas distribution solutions, such as shower heads, which are applicable in chemical vapour deposition, are impractical. However, most sputter processes work at a relatively low pressure compared to chemical vapour deposition and, at these low pressures, there is substantial random movement of individual gas molecules within the process chamber allowing a reasonable degree of gas uniformity to be achieved from very simple gas inlets, such as a single point inlet some distance from the target/substrate area, which is where the gas is used or consumed.

Sputter systems, however, generally have elaborate shielding parts, that are removable for cleaning or replacement. As a result the gas inlet, and indeed the pumping outlet, is generally located beneath the shielding and, consequentially, much of the gas never reaches the target/substrate area, as it is pumped away before the random motion enables it to arrive at its point of use. Where the process is non-reactive sputtering, this is less of a problem as the inert gas, typically argon, is there only to provide a source of working ions for the sputter process; the flow of gas and pumping being primarily to remove unwanted contaminants. With reactive sputtering (e.g. for refractory metal nitrides such as are used for barrier layers on semiconductor devices), a reactive gas, typically nitrogen, is consumed in the process. Here the uniformity of gas distribution is of much greater importance. Further, the location of the gas inlet can lead to poor process performance or unwanted nitride build up, which can flake and hence cause particulate contamination.

U.S. Pat. No. 6,296,747 describes an approach intended to solve these problems.

The gas inlet 44 and the high conductance pumping outlet 48 are located entirely below the lower sputtering shield 90. Gas is diffused by random motion through the gap 34. Additional conductance to the target/substrate area is provided by perforations 92 in the shielding 90, which is hidden from the plasma by a further shield 96. It will be noted that both the pumping outlet, for pumping from the process area, and the gas inlet to the processing area are defined by the same apertures i.e. the small gap 34 and the additional holes 92.

JP 1149956 discloses sputtering apparatus containing no shielding having a substrate holder 4 which is surrounded by an annular pipe 15 including inlet apertures arranged around its periphery at regular intervals. The holder 4 includes separate bores 7a, 7b which are used as outlets for the gas. However, the bores and the pump 2a face the target 3, which would cause material to be sputtered into the pump and pumping bores and also cause the pump and therefore the gas contained therein to heat up, which is undesirable and impractical in sputtering apparatus.

SUMMARY OF THE INVENTION

From a first aspect the invention consists in sputter apparatus including:
  (a) a chamber
  (b) a target
  (c) a work piece support having a support surface
  (d) a process area between the target and work piece support
  (e) an inlet for process gas; and
  (f) a pumping outlet from the process area
characterised in that the inlet substantially surrounds the support, the apparatus including a pumping outlet separate from the inlet and wherein the inlet is shielded from the process area.

The inlet may be shielded by being defined between a wall of the chamber and a chamber shield.

The inlet may debouch above the level of the support surface and, additionally or alternatively, the inlet may be constituted by one or more orifices.

In a preferred arrangement the apparatus further includes a plenum or gallery that substantially surrounds the support and is located upstream of the inlet and wherein the inlet is formed so that its gas conductance is less, preferably substantially less, than the gas conductance of the gallery. It is particularly preferred that the conductance of the inlet is substantially equal along its length. The gas conductance from the inlet to the outlet is typically less than the gas conductance from the inlet to the process area.

It will be understood that in a normal configuration, the support will be generally cylindrical and the inlet and/or gallery will extend substantially circumferentially around the support. Accordingly the inlet could be formed as a continuous slit or it can, as has been mentioned previously, be formed as a series of openings extending around the support. The pumping outlet may be annular and can substantially surround the support.

Conveniently the gallery is defined between a wall of the chamber and a chamber shield. The volume of the gallery can most readily be defined by a cavity formed in the chamber wall, but it may, in part or in whole, be defined by the shape of the shield.

The inlet may be defined between a wall of the chamber and the chamber shield. Additionally or alternatively the inlet may be defined in the chamber shield. Thus, for example, the chamber shield may have a castillated or serrated upper edge or it may be perforate at or adjacent that edge.

The support may be raisable or lowerable in operation, as is well known in the art, in which case it may have a constant cross-section portion and the chamber shield may have an extension projecting towards the constant cross-section portion to define therewith the pumping outlet such that the outlet has a fixed dimension in all operative positions of the support.

There may be a further shield extending into the chamber from a point above the inlet to define a gas diffusion path between the inlet and the chamber. In that case it is particularly preferred that the further shield projects to shield the pumping outlet. Conveniently the further shield may be perforate to enhance movement of the gas towards the process area.

From another aspect the invention consists in plasma processing apparatus including a chamber and a work piece support within the chamber raisable and lowerable during operation characterised in that the work piece support has a constant cross-section portion and the chamber or an element thereof includes a projection for co-operation with the constant cross-section portion to define a fixed dimension gas outlet in all operative positions of the support.

Whilst this approach is particularly convenient for sputtering apparatus of the type described above, it will be appreciated that there are benefits in many types of deposition and etching apparatus to be able to pump at a fixed rate whatever the operative position of the support. This structure is therefore broadly relevant to any substrate processing apparatus, in which the substrate support is movable between positions at times when pumping will occur.

Although the invention has been defined above it is to be understood it includes any inventive combination of the features set out above or in the following description.

BRIEF DESCRIPTION OF THE DRAWINGS

The invention may be performed in various ways and specific embodiments will now be described, by way of example, with reference to the accompanying drawings, in which.

DETAILED DESCRIPTION OF THE DRAWINGS

Figure 1:
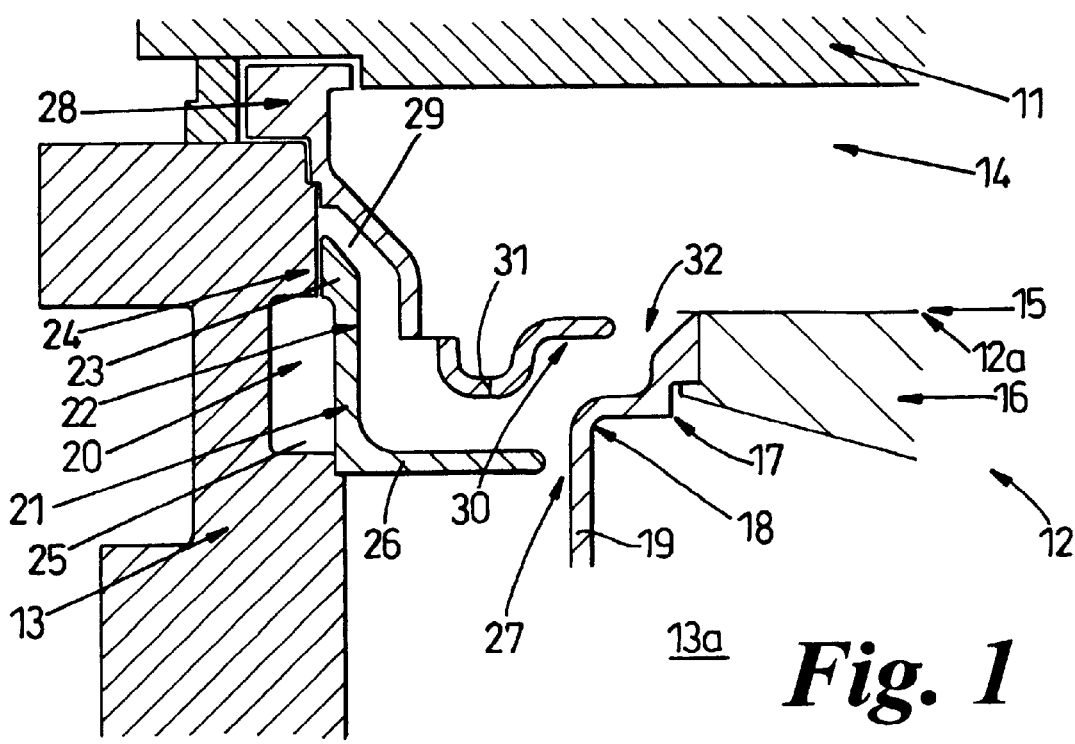
FIG. 1 is a scrap cross-section through one edge of a sputter apparatus.

Sputter apparatus, generally indicated at 10, includes a target 11 a work piece support 12 and a chamber 13a, partially defined by a wall, which is generally indicated at 13. A process area 14 lies between the target 11 and the support 12 and a work piece or substrate 15 sits on the upper surface 12a of the support 12. The support 12 includes a platen 16 and a dependent skirt 17, which is cranked at 18 before extending into a constant cross-section portion 19.

A plenum or gallery 20 is cut into the chamber wall 13 and substantially closed off by shielding 21. It will be noted that the shielding 21 is substantially L-shaped in section. The upright portion 22 extends to form one side of the gallery 20 and has a cranked upper edge 23 that stands slightly off the chamber wall 13 to define a circular restricted gas inlet 24 for the process area 14. Gas is supplied to the plenum 20 by one or more inlets, one of which is schematically shown at 25.

The horizontal arm 26 of the shielding 21 extends laterally to define a pumping outlet 27 with the constant cross-section portion 19, as will be described in more detail below. The pumping outlet thus defined is substantially annular and surrounds the support 12. A further shield 28 depends from a point above the inlet 24 to form a gas diffusion passage 29, that prevents jetting of gas into the process area 14. The shield 28 then extends laterally outwardly to shield the outlet 27 with its flange 30. The shield 28 is perforate, for example at 31, to allow gas to flow readily into the process area 14.

The shields 26 and 28 are, as is usual, removable for maintenance and cleaning purposes.

It will be appreciated that in the construction described in FIG. 1 the inlet 24 is in the form of an annular slot. The dimensions of this aperture or slot are selected such that its vacuum conductance is low compared to the conductance around the circumference of the gallery 20. This ensures there is a minimal pressure variation around the annular gallery 20, which in turn ensures a uniform flow of process gas through the inlet 24 into the process region 14. This uniform flow is as a result of the back pressure created within the gallery due to the low conductance of the inlet 24.

Having passed through the inlet 24 the gas diffuses along the passageway 29 through openings 31 or the gap 32 into the process region 14. It will be understood that as the gas is being fed uniformly right around the periphery of the process area 14 substantial gas uniformity will be achieved in that process area.

Figure 2:
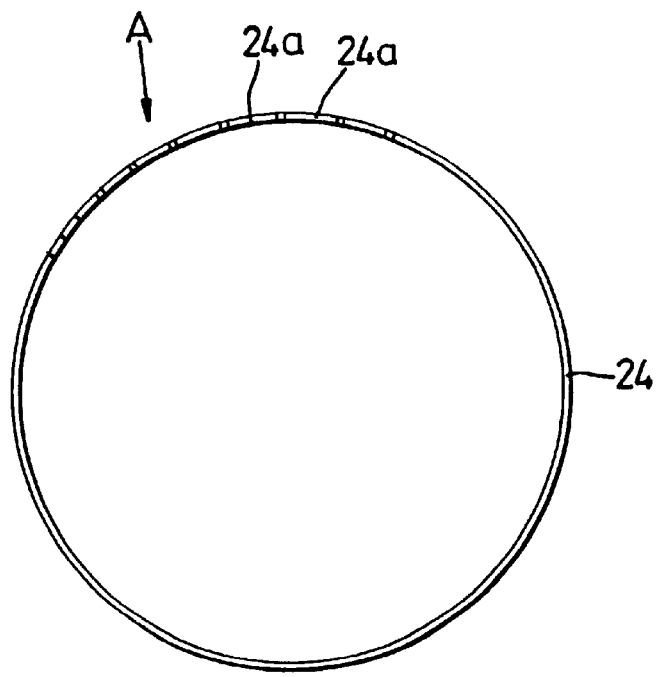
FIG. 2 is a schematic representation of an inlet made up from a number of orifices.

As can be seen, schematically, in FIG. 2 the slit 24 may extend circumferentially right around the chamber 14 or, it may be sub-divided into orifices 24a, as is indicated in sector A. The orifices 24a may be made up of a number of slots or many very fine holes, depending on the design considerations for the particular apparatus.

Returning to FIG. 1, the pumping outlet 27 will now be discussed in more detail. The work piece or substrate support 12 has, as has been explained already, a portion 19 which has a constant horizontal cross-section. By positioning the lateral projection 26 suitably relative to this portion 19 the outlet 27 can be defined between them, whatever the operative vertical position of the support 12. The dimensions of the pumping outlet 27 therefore remain fixed in all these operative positions. As is well known in the art, it is desirable to move the support first to allow handling of the substrate on and off the platen and secondly to allow the target to substrate distance to be adjusted in order to optimise process conditions. In particular it has been found that in the deposition of barrier layers, the barrier layer process may consist of a first metal deposition followed by a metal nitride deposition, e.g. tantalum and tantalum nitride, using first argon and then, secondly, argon and nitrogen as the sputtering gases. It has been found that when carrying out both these processes, sequentially, in the same process chamber different target to substrate distances are required for optimal processing.

In previous arrangements the pumping outlet has been defined so that its dimensions vary depending on the support position. These have had to be compensated either by adjustments to gas flow or to pumping speeds and hence introduce unwanted complexities into the control system.

The separation of the pumping outlet 27 from the gas inlet 24 enables the dimensions of each to be optimised for their particular purpose and the fact that each are defined by a single piece of shielding, which effectively seals the two paths, one from the other, means that if required a differently dimensioned or shaped shielding element 21 can be produced for specific processes, enabling a single chamber to be adapted and optimised from one process to another.

The dimensions of the inlet and the pumping outlet from the process area are uniform around the sides of the workpiece upon the support surface. In the embodiment described above, the gas conductance from the inlet 24 to the process area 14 is greater than the gas conductance directly from the inlet to the pumping outlet 27 that lies entirely below the level of the support surface 12a. Thus, a gas, in particular a reactive gas, introduced to the process chamber 13 is more likely to pass to the process area 14 (lying above the level of the substrate support surface 12a) than be wasted by being pumped away without reaching the process area. This contrasts with prior art arrangements where the gas conductance from the gas inlet to the process area is no greater than the gas conductance from the gas inlet directly to the pumping outlet.

I claim:

1. Sputter apparatus including:

(a) a chamber;

(b) a target;

(c) a work piece support having a support surface;

(d) a process area between the target and the work piece support;

(e) an inlet for process gas; and (f) a pumping outlet for pumping gas out of the process area, wherein the inlet substantially surrounds the support, wherein the pumping outlet is separate from the inlet, wherein the inlet is shielded from the process area, and wherein the inlet is shielded by being defined between a wall of the chamber and a chamber shield.

2. Apparatus as claimed in claim 1, wherein the inlet debouches above the level of the support surface.

3. Apparatus as claimed in claim 1, wherein the inlet is constituted by one or more orifices.

4. Apparatus as claimed in claim 1, further including a plenum or gallery that substantially surrounds the support and is located upstream of the inlet and wherein the gas conductance of the inlet is less than the gas conductance of the gallery.

5. Apparatus as claimed in claim 4, wherein the conductance of the inlet is substantially equal along its length.

6. Apparatus as claimed in claim 4, wherein the gallery is defined between a wall of the chamber and a chamber shield.

7. Apparatus as claimed in claim 1, wherein gas conductance from the inlet to the pumping outlet is less than gas conductance from the inlet to the process area.

8. Apparatus as claimed in claim 1, wherein the pumping outlet substantially surrounds the support.

9. Apparatus as claimed in claim 1, wherein the support can be raised and lowered in operation has a constant cross section portion and wherein the chamber shield has an extension projecting towards the constant cross-section portion to define therewith the pumping outlet such that the outlet has a fixed dimension in all operative positions of the support.

10. Apparatus as claimed in claim 1, further including a further shield extending into the chamber from a point above the inlet to define a gas diffusion path between the inlet and the chamber.

11. Apparatus as claimed in claim 10 wherein the support can be raised and lowered in operation has a constant cross section portion and wherein the chamber shield has an extension projecting towards the constant cross-section portion to define therewith the pumping outlet such that the outlet has a fixed dimension in all operative positions of the support and wherein the further shield projects to shield the outlet.

12. Substrate processing apparatus including a chamber and a substrate support within the chamber and raisable and lowerable during operation characterized in that the substrate support has a constant cross-section portion and the chamber or an element thereon includes a projection for co-operating with the constant cross-section portion to define a fixed dimension gas outlet in all operative positions of the support, the apparatus further including an inlet for process gas, the inlet being shielded by being defined between a wall of the chamber and a chamber shield.

13. Apparatus as claimed in claim 12 wherein the gas outlet is pumping outlet.

* * * * *